United States Patent [19]

Hughes

[11] Patent Number: 5,113,129
[45] Date of Patent: May 12, 1992

[54] APPARATUS FOR PROCESSING SAMPLE ANALOG ELECTRICAL SIGNALS

[75] Inventor: John B. Hughes, Hove, England

[73] Assignee: U.S. Philips Corporation, New York, N.Y.

[21] Appl. No.: 446,821

[22] Filed: Dec. 6, 1989

[30] Foreign Application Priority Data

Dec. 8, 1988 [GB] United Kingdom ............ 8828667.9

[51] Int. Cl.$^5$ .................................................. G05F 3/24
[52] U.S. Cl. ........................................... 323/316; 323/317
[58] Field of Search ............. 323/311, 312, 315, 316, 323/317; 307/296.1, 296.2, 296.6, 296.8, 352, 353

[56] References Cited

U.S. PATENT DOCUMENTS

| | | | |
|---|---|---|---|
| 4,675,594 | 6/1987 | Reinke | 323/317 |
| 4,740,743 | 4/1988 | Reisinger et al. | 323/316 |
| 4,864,217 | 9/1989 | Bird | 323/316 |
| 4,866,368 | 9/1989 | Bird | 323/317 |

Primary Examiner—Peter S. Wong
Attorney, Agent, or Firm—Bernard Franzblau

[57] ABSTRACT

A circuit arrangement for processing sampled analog electrical signals where each sample being in the form of an electrical current. The circuit arrangement includes apparatus for combining, in predetermined proportions, the input sample current in a present sample period with current(s) derived from input sample current(s) in one or more preceding sample periods, and apparatus for deriving the processed output signal from the combined current produced by the combining means in successive sample periods. The circuit arrangement consists of a plurality of circuit modules each of which deliver and accept bi-directional signal currents and which contain current sources so that internally only unidirectional currents are processed. The transistors which conduct signal currents are arranged to be of one conductivity type only. This reduces the voltage requirements at the interfaces between modules.

20 Claims, 7 Drawing Sheets

APPARATUS FOR PROCESSING SAMPLE ANALOG ELECTRICAL SIGNALS

BACKGROUND OF THE INVENTION

This invention relates to a circuit arrangement for processing sampled analog electric signals with each sample being in the form of an electric current. The circuit arrangement comprises means for combining, in predetermined proportions, the input sample current in a present sample period with current(s) derived from input sample curent(s) in one or more preceding sample periods, and means for deriving the processed output signal from the combined current produced by the combining means in successive sample periods.

A circuit arrangement as set forth in the preceding paragraph is disclosed in UK Patent Application No. 8721758 which corresponds to U.S. Pat. No. 4,864,217 which also discloses a method of processing sampled analog electric signals comprising the steps of (a) converting each sample into a current if it is not already in that form;

(b) combining, in predetermined proportions, the input sample current in the present sample period with the sample current(s) derived from input sample current(s) in one or more preceding sample periods; and (c) deriving the processed output signal from the combined current produced by step (b) in successive sampling periods.

Circuits constructed to operate in accordance with the method disclosed in the above referenced application, which are referred to hereinafter as switched current circuits, have a number of characteristics and advantages including the fact that the mathematics concerned with the application of z-transforms to switched capacitor circuits apply equally to circuits using this method. However, in contrast to switched capacitor circuits, high quality linear capacitors are not required. Consequently, the second polysilicon layer used to produce the capacitors in switched capacitor circuits may not be necessary which would make the processes for producing these circuits compatible with processes for making digital VLSI circuits, and hence the combination of analog and digital signal processing in a single integrated circuit may be simplified.

Processes for manufacturing VLSI circuits are generally devised and optimised for the production of digital circuits and are generally moving towards smaller dimensions and lower power supply voltages. Circuit arrangements for carrying out the method set forth in U.S. Pat. No. 4,864,217 are conveniently constructed using current mirror circuits which, in order to obtain the best performance, may include one or more source degeneration resistors, cascode conected device, or dynamic element matching. All these measures increase the voltage required to keep the active devices in saturation.

SUMMARY OF THE INVENTION

It is an object of the invention to provide a circuit arrangement capable of operating according to the method disclosed in U.S. Pat. No. 4,864,217 which will operate with comparatively low power supply voltages.

The invention provides a circuit arrangement for processing sampled analog electrical signals, each sample being in the form of a current, the circuit arrangement comprising means for combining, in predetermined proportions, an input sample current in the present sample period with current(s) derived from input sample current(s) in one or more preceding sample periods, and means for deriving the processed output signal from the combined current produced by the combining means in successive sample periods, wherein the circuit arrangement comprises transistors and all of the transistors which conduct signal currents are formed by devices having the same polarity.

UK Patent Application No. 8816072.6 which corresponds to U.S. Pat. No. 4,958,123 Sep. 18, 1990 discloses a circuit arrangement which carries out the method disclosed in U.S. Pat. No. 4,864,217 and which comprises a plurality of circuit modules, each circuit module having a current input for receiving a bi-directional input signal current and a current output for supplying a bi-directional output signal current, means for adding a bias current to the bi-directional input current to produce a uni-directional current for processing by the circuit module and means for subtracting a suitably scaled bias current from the processed uni-directional current to produce a bi-directional current at the current output of the circuit module.

By constructing the circuit arrangement from a plurality of circuit modules, which can be designed to perform particular functions, such as current storage, current amplification, current addition or subtraction, current inversion, and transferring only signal currents between the circuit modules, large systems can be constructed without requiring accurately matched bias current sources at widely spaced locations on an integrated circuit substrate. Thus, a complex signal processing arrangement can be implemented using comparatively simple building block modules in which each module is capable of receiving and producing bi-directional currents even though within the module only uni-directional currents can be handled.

The circuit modules disclosed in U.S. Pat. No. 4,958,123 are constructed using current mirror circuits formed by n-channel field effect transistors and p-channel field effect transistors. The signal currents pass through current mirror circuits of both types and consequently it is necessary that each type of current mirror circuit have a similar performance with regard to accuracy, bandwidth, etc. This leads to a requirement for larger devices in the current mirror circuits formed by p-channel transistors. In addition, current mirror circuits formed by n-channel and p-channel transistors are connected in series across the power supply rails and this causes difficulty in maintaining operation in the saturation region from the low voltage supplies used in presently produced VLSI circuits and the even lower voltage supplies expected in future VLSI circuits.

By providing that signal currents flow only through current mirror, or other, circuits formed using transistors of one polarity only, the series connection of two current mirror, or other, circuits across the power supply rails can be eliminated thereby reducing the voltage required to keep the devices operating in the saturated region.

The transistors which carry signal currents may be formed as n-channel field effect transistors. The advantages of using n-channel field effect transistors rather than p-channel field effect transistors are that for a given construction they have a wider bandwidth, a lower voltage for a given current, and a lower threshold voltage. Thus, the capability for operating at lower power rail voltages can be maximized.

Alternatively, the transistors which carry signal currents may be formed as p-channel field effect transistors. The advantages of using p-channel field effect transistors rather than n-channel transistors are that in some n-well processes better matching between devices may be achievable and cross-talk from digital circuits formed on the same substrate can be screened.

As with the circuit arrangement disclosed in U.S. Pat. No. 4,958,123 the circuit arrangement according to the present invention may comprises a plurality of circuit modules, each circuit module having a current input for receiving a bi-directional input signal current and a current output for supplying a bi-directional output signal current, means for adding a bias current to the bi-directional input signal current to produce a uni-directional current for processing by the circuit module, and means for subtracting a suitably scaled bias current from the processed uni-directional current to produce a bi-directional output signal current.

This gives the same properties and advantages as disclosed in U.S. Pat. No. 4,958,123 the contents of which are hereby incorporated by reference.

One of the circuit modules may comprise a current memory module which is capable of reproducing at its output in one sampling period a scaled version of the current applied to its input in a previous sampling period.

In order to process signals in switched current circuits it is necessary to be able to store currents from one sampling period to the next so that sample currents occurring in different sample periods can be combined in a desired manner to perform a given signal processing function.

The current memory module may comprise a current input, a current output, first and second switches controlled by first and second non-overlapping clock signals, and first and second memory cells, wherein the current input is coupled to the first memory cell by means of the first switch and the first memory cell is coupled to the second memory cell by means of the second switch, the output of the second memory cell being coupled to the current output. Each memory cell may comprise a field effect transistor having a capacitor connected between its gate and source electrodes. By storing a charge on a capacitor which causes the gate-source potential of a field effect transistor to be maintained when the driving source is removed, the current produced through the transistor by the driving source can be maintained by the charge on the capacitor. Of course, the effectiveness of the current maintainance depends on the input resistance of the transistor and the period during which the current is to be maintained. Consequently, this is one factor which limits the maximum sampling period.

In each memory cell the field effect transistor may form an output branch of a current mirror circuit. The first and second switches may be arranged to isolate the input and output branches of the current mirror circuits, the output branch of the first current mirror circuit being connected to the input branch of the second current mirror circuit.

Forming the current memory cells as current mirror circuits having their input and output branches isolated by a switch enables the input current to be accurately produced at the output and enables the capacitor to be charged to the correct potential to maintain the output current at the desired value.

At least one of the current mirror circuits may have a non-unity current ratio between its input and output branches. The second current mirror circuit may have a plurality of output branches. This enables the current memory to additionally be given a gain function and/or to be provided with a plurality of independent outputs which may be distributed to various parts of the circuit arrangement, as required.

The current memory module may include a first memory cell having an input, an output, means comprising a first switch which is conductive during a first portion of a sample period for connecting the input of the first memory cell to the main current conducting path of a transistor, means comprising a second switch which is conductive during the first portion for connecting the junction of the first switch and the main current conducting path of the transistor to a current maintaining means, and means for connecting the main current conducting path of the transistor to the output of the first memory cell during a second portion of the sampling period, a second memory cell having an input coupled to the output of the first memory cell and an output coupled to the output of the current memory module, and means for coupling the input of the current memory module to the input of the first memory cell.

By using the same transistor for both the input and the output current, errors due to transistor mismatching can be eliminated. However, the output from this alternative memory cell is only available during the second portion of the sampling period.

The means for connecting the main current conducting path of the transistor to the output of the first memory cell may comprise a third switch which is conductive during a second portion of the sampling period which does not overlap the first portion, an output current from the first memory cell being available when the third switch is conductive.

The second memory cell may comprise an input, an output, means comprising a first switch which is conductive during a second portion of a sample period for connecting the input of the second memory cell to the main current conducting path of a transistor, means comprising a second switch which is conductive during the second portion for connecting the junction of the first switch and the main current conducting path of the transistor to a current maintaining means, and means comprising a third switch which is conductive during a first portion of the sampling period which does not overlap the first portion for connecting the main current conducting path of the transistor to the output of the second memory cell, an output current from the current memory being available when the third switch is conductive.

The means for subtracting a suitably scaled bias current may comprise a bias current source connected to the input of a current mirror circuit having a number of outputs corresponding to the number of outputs of the current memory module, the output current(s) produced by the current mirror circuit being subtracted from the corresponding output current(s) of the second memory cell.

This enables a single bias current source to be used to subtract bias currents from a plurality of outputs. Any necessary scaling of individual bias currents can be accomplished in the various output branches of the current mirror circuit.

The memory module may have differential inputs and outputs and comprise a plurality of current memory cells, means for coupling each of the differential inputs to a respective current memory cell and means for combining the outputs of selected memory cells for application to the differential current outputs. By performing the signal processing using differential currents, improved performance can be achieved as common mode errors are significantly reduced and power supply noise and even harmonic distortion can be suppressed.

One of the circuit modules may comprise an integrator circuit module which is capable of integrating a bi-directional current applied to its input. The integrator circuit module may comprise a current memory module as set forth herein before and a feedback loop from a stored current output to a summing arrangement so that a stored current can be added to each current input sample. The integrator may be arranged to integrate differential input currents. The integrator module may be arranged to perform either lossy or lossless integration, for example, by appropriately choosing the current ratios of current mirror circuits forming or associated with current memory cells. The integrator modules are useful in forming various filter sections which may be used to construct filters of any desired complexity.

One of the circuit modules may comprise a static module which is capable of producing at its output a scaled version of the current applied to its input at its output. The static module may have a plurality of inputs by means of which a plurality of input currents may be applied to the static module to enable current addition or subtraction to be performed by the static module. The static module may perform a current inversion between its input(s) and output(s).

The static modules allow functions of current gain, signal inversion, current addition, current subtraction, and 'fan-out' to be performed.

The static module may comprise a current scaling circuit, the current scaling circuit comprising means for applying an input current to the input branch of a first current mirror circuit, means for applying a bias current to the input branch of the first current mirror circuit, means for feeding the current from the output branch of the first current mirror circuit to the input branch of a second current mirror circuit, means for feeding the current from the output branch of the second current mirror circuit to the output of the static module, and means for subtracting a bias current so that the output current produced by the scaling circuit is a scaled version of the input current applied to the input of the scaling circuit.

Since the static module has its input connected to the input branch of a current mirror circuit, which input branch is commonly formed by a diode connected transistor, it is necessary to ensure that when that is so the current flows in the current conducting direction of the diode. The provision of a bias current which is added to the input current enables this condition to be achieved for values of input current within the designed range. It would be possible, if a current inversion were desired, to take the output from the output branch of the first current mirror circuit and subtract the bias current, or a multiplied version of the bias current if the first current mirror has a current multiplication factor, from the current in the output branch of the first current mirror circuit to produce the required output current of the static module.

The means for applying a bias current to the input branch of the first current mirror circuit may comprise a first current source and means for adding the current produced by the first current source to the input current and the means for subtracting a bias current may comprise a second current source and a current summing junction to which the output current from the second current source and the output current from the output branch of the second current mirror are applied with appropriate polarity, and means for deriving the scaled output current from the summing junction. The second current mirror circuit may have a plurality of outputs, the static module having a corresponding plurality of outputs, each output of the second current mirror circuit being coupled to a corresponding output of the static module. The means for subtracting the suitably scaled bias current may comprise a bias current source connected to the input of a further current mirror circuit having a number of outputs corresponding to the number of outputs of the second current mirror circuit, the output current(s) produced by the further current mirror circuit being subtracted from the corresponding output current(s) of the second current mirror circuit. The static module may be arranged to produce an inversion of the current applied to its input at its output, the input of the static module being coupled to the input of the further current mirror circuit instead of to the input of the first current mirror circuit.

The static module may be arranged to subtract a first current from a second current and have a first input for application of the second current which is coupled to the input of the first current mirror circuit, a second input for application of the first current which is coupled to the input of the further current mirror circuit, and one or more outputs which are coupled to respective output branches of the second current mirror circuit.

The static module may be arranged to process a differential input current and produce a differential output current. The static module may comprise first and second inputs for receiving a differential input current, first and second outputs for producing a differential output current, means for coupling the first input to a first input of a first current summing means, means for coupling a first bias current source to a second input of the first current summing means, means for coupling the output of the first current summing means to the input branch of a first current mirror circuit, means for coupling the second input to a first input of a second current summing means, means for coupling a second bias current source to a second input of the second current summing means, means for coupling the output of the second current summing means to the input branch of a second current mirror circuit, means for coupling a first output branch of the first current mirror circuit to the input branch of a third current mirror circuit, means for coupling a first output branch of the second current mirror circuit to the input branch of a fourth current mirror circuit, means for coupling a second output branch of the first current mirror circuit to a first input of a third current summing means, means for coupling the output branch of the fourth current mirror circuit to a second input of the third current summing means, means for coupling the output of the third current summing means to the first output, means for coupling a second branch of the second current mirror circuit to a first input of a fourth current summing means, means for coupling an output branch of the third current mirror circuit to a second input of the fourth current summing means, and means for coupling the output of the fourth summing means to the second output.

The static module may have a number of further differential outputs wherein each of the current mirror circuits has a corresponding number of further output branches each of which is connected to appropriate further summing nodes.

The static module may have a number of further differential inputs, each further differential input being connected to a further input of the first and second summing nodes.

One of the circuit modules may comprise an integrator. The integrator may be a bi-linear integrator. The integrator may be ideal or lossy. Various filter sections and filters may be formed utilising one or more ideal and or lossy integrators.

The bilinear integrator may comprise first and second inputs and an output, means for connecting the first input to the input of a first current memory cell which is arranged to store the current applied in a first portion of each sampling period and to reproduce a current, whose magnitude is dependent on that of the applied current, at an output during a second portion of that or a succeeding sample period, means for connecting the second input to the input of a second current memory cell which is arranged to store the current applied to its input in the second portion of each sampling period and to reproduce at each of a plurality of outputs a current, whose magnitude is dependent upon that of the current applied to its input, during the first portion of that or a succeeding sampling period, means for connecting the first output of the second current memory cell to the input of the first current memory cell, means for connecting the output of the first current memory cell to the input of the second current memory cell, and means for connecting the second output of the second current memory cell to the output of the integrator circuit.

The second current memory cell may be constructed so that the output current produced at its first output is equal to B times the current applied to its input where B is less than one.

This enables a lossy integrator to be produced. Clearly, when B is equal to one an ideal integrator is produced. Lossy integrators may be used in conjunction with ideal integrators to form various bi-quadratic filter sections, for example, the Tow-Thomas bi-quadratic section.

The integrator may further comprise means for adding a bias current to the current applied to the first input of the integrator and means for subtracting appropriately scaled bias currents from the first and second output currents of the second current memory cell so that the output current produced by the integrator contains no bias current component.

This enables bi-directional currents to be processed while maintaining unidirectional currents at the inputs to the current memory cells and enables integrator circuits to be formed which produce a bi-directional signal current output having no bias current component. Thus, an integrator circuit can be constructed which operates on bi-directional input signal currents and produces bi-directional output signal currents, all necessary bias currents being produced within the integrator circuit. This eases the problem of matching the bias current sources when a plurality of integrator circuits are interconnected to form a filter as they can be integrated in close proximity thus minimizes the effect of process variables which may exist across the often extensive chip area of a VLSI circuit.

The first current memory cell may comprise an input connected to a diode connected field effect transistor, the gate electrode of which is connected through a switch to the gate electrode of a second similarly constructed field effect transistor, the first and second transistors having their source electrodes connected to a common point, an output connected to the drain electrode of the second transistor, a capacitor connected between the source and gate electrodes of the second transistor, and means for closing the switch only during the first portion of each sampling period.

This provides a convenient circuit implementation for the current memory cell, the output current being available throughout a sampling period apart from the short time during which the capacitor is charged by the input current during the first portion of the sampling period. This circuit is basically a current mirror circuit whose input and output branches are isolated by the switch, the current being maintained in the output branch by the charge on the capacitor. Consequently, any techniques used to improve the performance of current mirror circuits could be used with the current memory circuit, for example, cascode connection in the input and output branches, source degeneration, dynamic element matching, multiple output paths having the same or different currents.

Alternatively, the first current memory cell may comprise a first switch connected between its input and the drain electrode of a field effect transistor, a second switch connected between the gate and drain electrodes of the transistor, a capacitor connected between the gate and source electrodes of the transistor, a third switch connected between the drain electrode of the transistor and its output, means for closing the first and second switches only during the first portion of each sampling period, and means for closing the third switch only during the second portion of each sampling period.

This alternative current memory cell has the advantage that the same transistor is used as the input diode and the output device, thus eliminating errors due to device mismatch, but has the disadvantage that the output current is only available during the second portion of each sampling period.

The integrator circuit may be arranged for integrating a differential input current and for producing a differential output current, output current, in which case the integrator circuit may further comprise a second output, a third current memory cell, a fourth current memory cell, means for coupling an output of the third current memory cell to the input of the fourth current memory cell, means for coupling a first output of the fourth current memory cell to the input of the third current memory cell, means for connecting the first input of the integrator circuit to the input of the first current memory cell during the first portion of each sampling period, means for connecting the first input of the integrator circuit to the input of the fourth current memory cell during the second portion of each sampling period, means for connecting the second input of the integrator circuit to the input of the third current memory cell during the first portion of each sampling period, means for connecting the second input of the integrator circuit to the input of the second current memory cell during the second portion of each sampling period, means for connecting the second output of the second current memory cell to the first output of the integrator circuit, and means for connecting a second output of the fourth memory cell to the second output of the integrator circuit.

This enables the provision of a double balanced differential integrator circuit. As is well known, double balanced differential circuits suppress common mode input signals and power supply noise signals and consequently an improved performance over single ended integrators can be achieved.

The integrator may further comprise means for adding bias currents to the currents applied to the inputs of the first and third current memory cells and means for subtracting appropriately scaled bias currents from the outputs of the second and fourth current memory cells so that the output differential currents contain no bias current component.

BRIEF DESCRIPTION OF THE DRAWING

Embodiments of the invention will now be described, by way of example, with reference to the accompanying drawings, in which.

DESCRIPTION OF THE PREFERRED EMBODIMENTS

Figure 1:
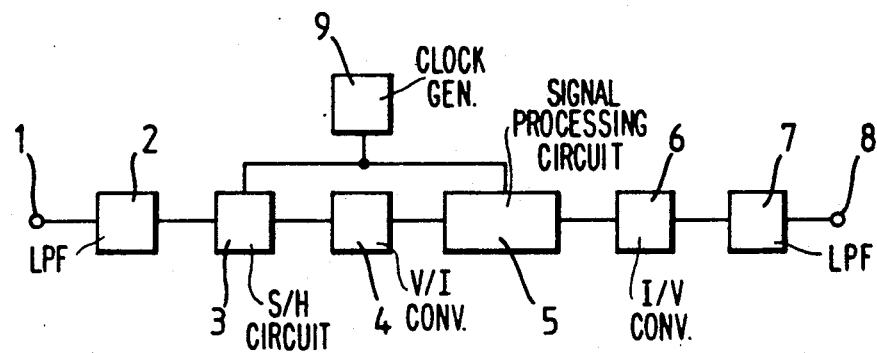
FIG. 1 shows in block schematic form a circuit arrangement incorporating the invention.

FIG. 1 shows a circuit arrangement for processing sampled analogue electrical signals in which the invention is included. The circuit arrangement shown in FIG. 1 has an input 1 which is fed to a low-pass filter 2 which acts as an anti-alias filter. The low-pass filter 2 may be omitted if the signal is naturally band limited. The output of the filter 2 is fed to the input of a sample and hold circuit 3 which produces a sampled input which is fed to a voltage to current converter 4. The output of the voltage to current converter produces a sampled current output which is fed to a signal processing circuit 5. Alternatively, the voltage to current conversion could take place prior to the filtering but, of course, it is necessary to filter before sampling unless the input signal is naturally band limited. The output of the signal processing circuit 5 is fed to a current to voltage converter 6 whose output is passed through a low pass filter 7 to the output 8 of the arrangement. A clock signal is fed from a clock generator 9 to the sample and hold circuit 3 and to the signal processing circuit 5. If the arrangement were such that the input signal at input 1 was in the form of a current rather than a voltage, then the voltage to current converter 4 could be omitted. Similarly, if the output signal at output 8 was required to be a current output then the current to voltage converter 6 would be omitted.

The signal processing circuit 5 is arranged to manipulate sampled currents to produce the desired output signal. The precise form of the signal processing circuit 5 will depend on the signal manipulation to be performed. It may, for example, comprise one or more integrator circuits. The signal manipulation is carried out by combining, in desired proportions, the electrical current in a present sample period with the electrical currents in one or more preceding sample periods. Consequently, the signal processing circuit 5 must be capable of making available the currents from at least the preceding sample period. This does not, however, means that the input current itself in the preceding sample period has to be available, but merely that it or the manipulated current for the previous sample period be available together with the input current in the present sample period. Typical circuit elements required to perform the manipulation of current samples are current mirror circuits and a current memory. Furthermore in the majority of applications the electrical variable is voltage rather than current and hence it is then necessary to provide a voltage to current converter and a corresponding current to voltage converter to enable interfacing between the signal processing circuit 5 and external parts of the system.

In order to perform the signal processing once the signal has been converted to a sampled current, two basic modules, a static module and a memory module, are required in various combinations in the signal processing arrangements 5 dependent on the signal manipulation to be carried out. These modules may be built from current mirror circuits and for simplicity in describing the static and memory modules a basic current mirror circuit will be shown. However, better performance may be achieved by using combinations of alternative current mirror circuits.

The static modules may have a variety of forms to provide for addition, subtraction or scaling of currents or to provide a 'fan-out' or plurality of output currents. Similarly the current memory modules may include addition, subtraction, multiplication, and 'fan-out' capability. Additionally both the static and memory modules may have single ended or differential inputs and outputs.

Further modules which may be provided include ideal and lossy integrators which may be constructed from current memory modules provided with appropriate outputs and feedback connections.

Each of the modules provided in the signal processing arrangement 5 may be arranged to be capable of accepting bi-directional current inputs and producing a bi-directional current output. Since the input to a module may be connected to a diode it is necessary to convert the bi-directional input current to a uni-directional input current. This may be achieved by adding a bias current which is generated within the module to the input current. To obtain a bi-directional output current, a bias current is subtracted from the output current. If the module performs a scaling function it is of course necessary to subtract an appropriately scaled bias current from the output current. By this means only signal currents are passed between the modules and the bias currents in one module are independent of and have no effect on the bias currents in the other modules. Thus matching of bias currents is only necessary within a module, which will normally be a compact unit occupying only a small area of the substrate on which the integrated circuit is formed and hence the processing conditions are unlikely to vary significantly within a module thus reducing the problems involved in producing matched current sources.

U.S. Pat. No. 4,958,123 describes a family of static and memory modules which accept bi-directional input signal currents and produce bi-directional output signal currents and contain within the module sources of bias current to enable uni-directional currents to be processed as uni-directional currents within the module. This family of modules, which includes both single ended and differential forms, uses both current mirror circuits employing n-channel devices and current mirror circuits employing p-channel devices. Thus, signal currents are passed from current mirror circuits formed by n-channel devices to further current mirror circuits formed by p-channel devices. The modules described in the aforesaid U.S. patent have many desirable properties, that is they have internal bias currents to allow bipolar or bi-directional input and output currents, they transmit only signal currents between modules and they can be implemented in fully differential as well as single ended structures. This is a flexible approach which can be extended to a whole family of modules. However, these modules have some disadvantages. First, since current mirror circuits formed from both n-channel devices and p-channel devices handle signal currents, both forms of current mirror circuit must have similar performance, for example, accuracy, bandwidth, input and output impedance. This leads to the requirement for larger devices in the p-channel current mirror circuits because its transistors have lower electron mobility. Secondly, because the p-channel current mirror circuit is connected in series with an n-channel current mirror circuit across the supply voltage there is difficulty in maintaining operation of the transistors in their saturated region from the low supply votages used in modern VLSI processes. This problem will becomes increasingly difficult as the trend in VLSI processes is to scale dimensions downwards and to use lower supply voltages.

Figure 2:
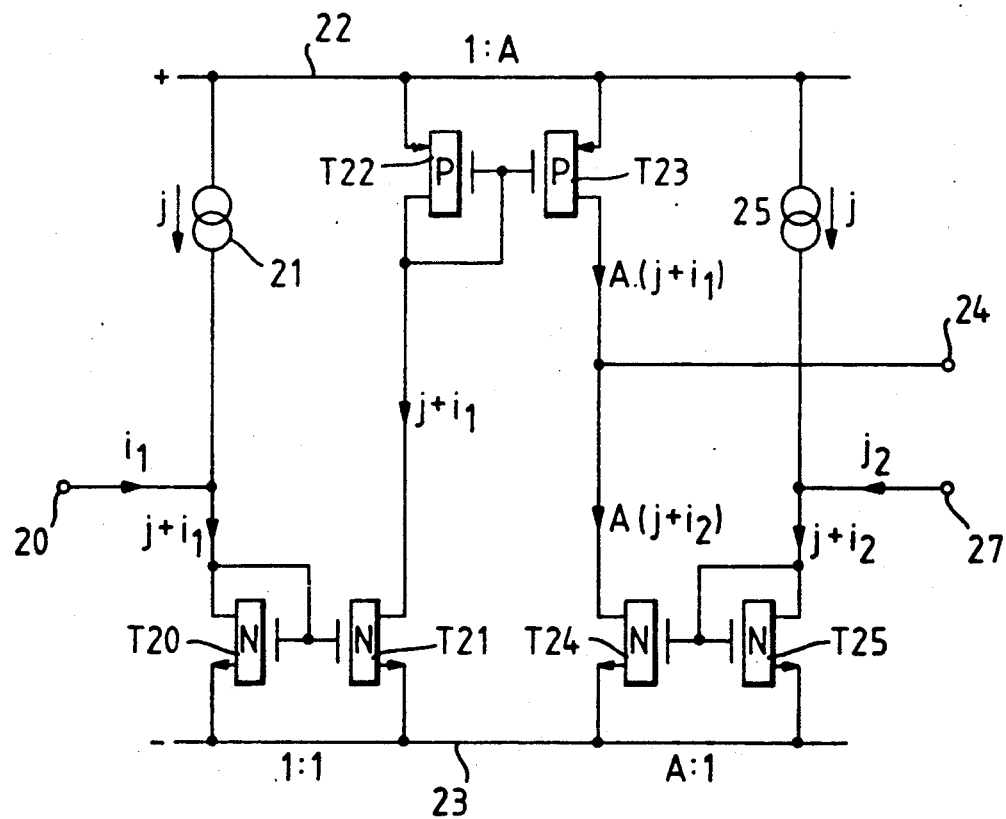
FIG. 2 shows a circuit module for use in a circuit arrangement for processing sampled analogue signals, the circuit module utilizing current mirror circuits formed by p-channel field effect transistors and by n-channel field effect transistors.

FIG. 2 shows a static module which performs the function of a subtracting scaler and which is of the form disclosed in U.S. Pat. No. 4,958,123. The subtracting scaler shown in FIG. 2 has a first input 20 which is connected to the junction of a current source 21 and the drain electrode of an n-channel field effect transistor T20. The current source 21 and transistor T20 are connected in series between positive and negative supply rails 22 and 23, respectively. The gate electrode of transistor T20 is connected to its drain electrode and to the gate electrode of a further n-channel field effect transistor T21. The source electrodes of transistors T20 and T21 are both connected to the negative supply rail 23. The drain electrode of transistor T21 is connected to the drain electrode of a p-channel field effect transistor T22 whose source electrode is connected to the positive supply rail 22. The drain electrode of transistor T22 is connected to its gate electrode and to the gate electrode of a further p-channel field effect transistor T23 whose source electrode is connected to the positive suppply rail 22. The drain electrode of transistor T23 is connected to the drain electrode of an n-channel field effect transistor T24 and to an output terminal 24. A current source 25 is connected between the positive supply rail 22 and the drain electrode of an n-channel field effect transistor T25. A further input terminal 27 is connected to the junction of the current source 25 and the drain electrode of the transistor T25. The drain electrode of transistor T25 is further connected to its gate electrode and to the gate electrode of transistor T24. The source electrodes of transistors T24 and T25 are connected to the negative supply rail 23. Transistors T20 and T21 are identically dimensioned and form a first current mirror circuit having unity gain, that is its input and output currents are equal. The transistors T22 and T23 form a second current mirror circuit but the channel width to length ratios of transistor T23 and transistor T22 are chosen to cause the output current from the drain electrode of transistor T23 to be A times the input current applied to the drain electrode of transistor T22. Similarly the transistors T24 and T25 form a third current mirror circuit, the channel width to length ratios of transistors T24 and T25 being chosen to make the output current from the drain electrode of transistor T24 equal to A times the input current applied to the drain electrode of transistor T25.

The current sources 21 and 25 each produce a current j. Thus the input $i_1$ at input 20 can have a value up to $-j$ without reverse biasing the input diode connected transistor T20. Similarly the input current $i_2$ at input 27 can also have a value of up to $-j$ without reverse biasing the input diode connected transistor T25. The input circuit will normally be designed to handle currents of 2j so that the input currents $i_1$ and $i_2$ can vary between $\pm j$. If a current $i_1$ is applied to input 20 the output of the first current mirror circuit formed by transistors T20 and T21 will produce a current $j+i_1$ in the direction shown in FIG. 2. This current is fed to the input of the second current mirror circuit formed by transistors T22 and T23 which, as a result, produces at its output a current $A.(j+i_1)$ in the direction shown in FIG. 2. If a current $i_2$ is applied to the input 27, it will be added to the current j produced by the current source 25 and applied to the input of the third current mirror circuit which, as a result, will produce at its output the current $A.(j+i_2)$ in the direction shown in FIG. 2. Consequently, the current supplied to the output 24 is the difference between the output currents produced by the second and third current mirror circuits $A.(j+i_1)-A.(-j+i_2)$ which is equal to $A.(i_1-i_2)$. Thus the current at the output 24 is equal to A times the difference between the currents at the inputs 20 and 27 and the module shown in FIG. 2 provides both a current scaling and current subtraction function. Clearly, a straightforward current scaling function can be performed by this circuit if the input current $i_2$ is zero or an inverted current scaling can be performed if the input current $i_1$ is zero.

Within the static modules shown in FIG. 2 a bias current j has been added to the input current and then an equal bias current j has been subtracted from the output current (multiplied by any scaling factor, if necessary). Thus bi-directional signal currents can be applied to the inputs of each module and produced at the corresponding output. There is a requirement for two matched current sources but these can be located close together within an integrated circuit to minimise mismatches between currents produced by the two current sources.

Figure 3:
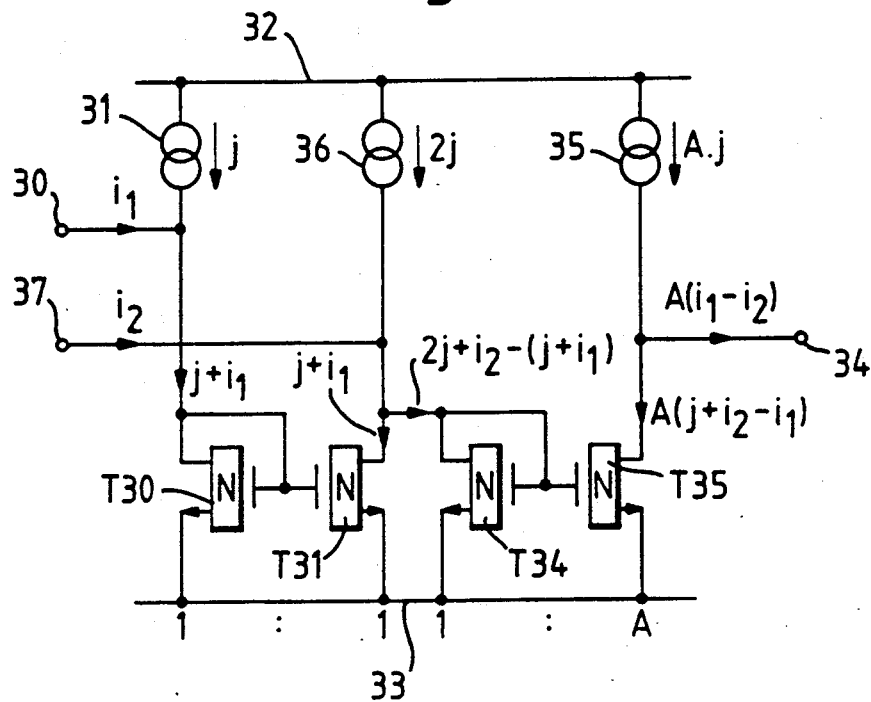
FIG. 3 shows a first embodiment of a circuit module for use in a circuit arrangement for processing sampled analogue signals according to the invention.

FIG. 3 shows a current scaling circuit according to the invention where only n-channel field effect transistors are used in the current mirror circuit. The subtracting scaler shown in FIG. 3 has a first input 30 which is connected to the junction of a current source 31 and the drain electrode of an n-channel field effect transistor T30. The other end of the current source T31 is connected to a positive supply rail 32 while the source electrode of transistor T30 is connected to a negative supply rail 33. The drain electrode of transistor T30 is connected to its gate electrode and to the gate electrode of an n-channel field effect transistor T31 whose source electrode is connected to the negative supply rail 33. The drain electrode of transistor T31 is connected via a current source 36 to the positive supply rail 32, to a second input terminal 37 and to the drain electrode of an n-channel field effect transistor T34. The source electrode of transistor T34 is connected to the negative supply rail 33 while its drain electrode is connected to its gate electrode and to the gate electrode of an n-channel field effect transistor T35. The source electrode of transistor T35 is connected to the negative supply rail 33 while its drain electrode is connected to an output terminal 34 and, via a current source 35, to the positive supply rail 32. The current source 31 is arranged to produce a current j while the current source 36 is arranged to produce a current 2j and current source 35 is arranged to produce a current A.j. The first current mirror circuit formed by transistors T30 and T31 is arranged to have a current ratio of unity while the second mirror circuit formed by transistors T34 and T35 is arranged to have a current ratio of 1:A.

In operation an input current $i_1$ is connected to input 30 and as a result the current $j+i_1$ is connected to the input of the first current mirror circuit. Consequently, the output of the first current mirror circuit is also $j+i_1$. If an input current $i_2$ is fed to input 37, then the current fed to the input of the second current mirror circuit will be equal to $2j+i_2-(j+i_1)$ which is equal to $j+i_2-i_1$. This causes the second mirror circuit to produce the current $A.(j+i_2-i_1)$ at its output. Consequently, the current at output 34 is equal to $A.j - A.(j+i_2-i_1)$ which is equal to $A(i_1-i_2)$.

Figure 4:
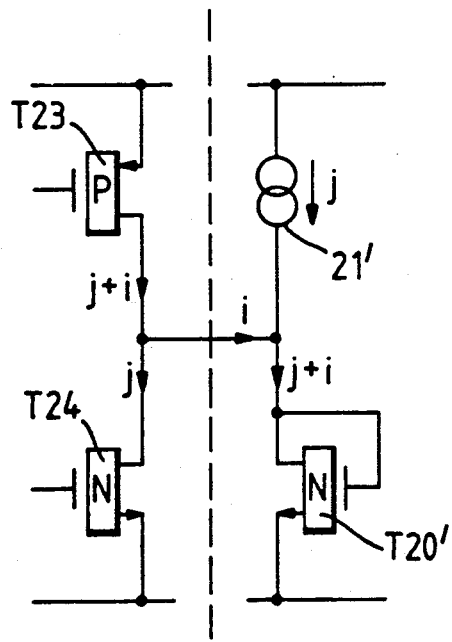
FIG. 4 shows the interface between two circuit modules as shown in FIG. 2.

FIG. 4 shows the interface between two modules of the form shown in FIG. 2. It is assumed that the value of A is equal to 1, that input current $i_1=i$ and input current $i_2=0$. With these assumptions the current through transistor T23 is equal to $j+i$ and that through transistor T24 is equal to j giving rise to the current i which is transferred between the output of one current scaling circuit and the input of the next. The current source 21' produces the current j and the transistor T20' carries the currrent $j+i$.

Figure 5:
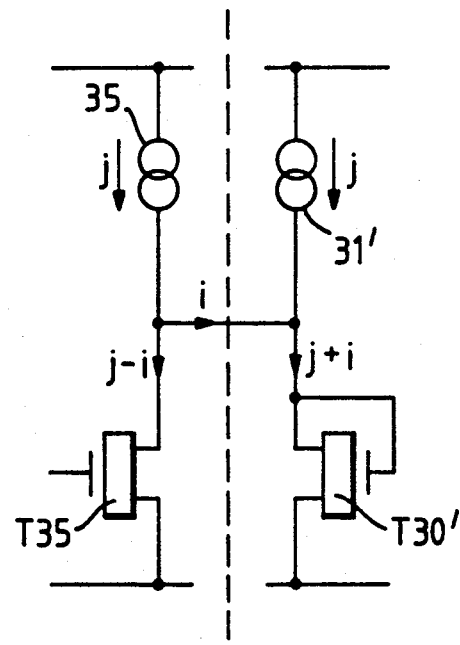
FIG. 5 shows the interface between two circuit modules as shown in FIG. 3.

FIG. 5 shows a corresponding interface between two current scaling circuits as shown in FIG. 3. Again it is assumed that A=1, $i_1=i$ and $i_2=0$. In this case the current source 35 passes the current j, while the transistor T35 conducts the current $j-i$. Again the current i is passed between the two current scaling circuits and applied to the input of the second. In the input circuit of the second current scaling circuit, the current source 31' produces the current j while the transistor T30' conducts the current $j+i$.

It can be seen from a comparison between the interface arrangements shown in FIGS. 4 and 5 that the output of the second current mirror of the scaling circuit shown in FIG. 2 is connected to the input of the first current mirror of the subsequent scaling circuit of the type shown in FIG. 2. These current mirrors are connected in series across the supply rails and both conduct the current $j+i$.

However, with the interface circuits shown in FIG. 5 between the current scaling circuits shown in FIG. 3, the current source 35 is connected in series with the first current mirror circuit of the succeeding module across the supply rails. The current source 35 conducts the current j whereas the transistor T23, which forms the output branch of the first current mirror conducts the current $j+i$. Thus the saturation voltage of the output transistor which produces the constant current j, that is the current source 35, will be less than a similar device carrying the current $j+i$, that is the transistor T23 forming the output branch of the second current mirror circuit in the arrangement of FIG. 2. Consequently, the allowable supply voltage can be lower for the same range of input signal current or alternatively a smaller p-channel device could be used. The current sources for the arrangement shown in FIG. 3 may be constructed from p-channel field effect transistor arrangements if the process is CMOS. Alternatively, if an NMOS process is used, the current sources could be constructed from depletion mode transistor arrangements. In either case the signal current only flows in the current mirror circuits constructed from n-channel transistors, thereby relaxing the design constraints. The difference between the arrangements shown in FIGS. 2 and 3 may be even more pronounced when source degeneration resistors are used in the current sources and p-channel current mirror circuits. This arises since a lower accuracy is demanded in the matching between bias currents since this merely results in a current offset and so the same circuit signal performance may be obtained using smaller source degeneration resistors or even dispensing altogether with source degeneration resistors in the current sources.

A full family of static modules may be produced using only current mirror circuits employing n-channel field effect transistors. Clearly by analogy with the static modules shown in U.S. Pat. No. 4,958,123, n-channel current scaling modules having multiple inputs and multiple outputs can be constructed. FIG. 3 shows a representative single ended circuit while FIG. 6 shows a representative differential current scaling circuit.

Figure 6:
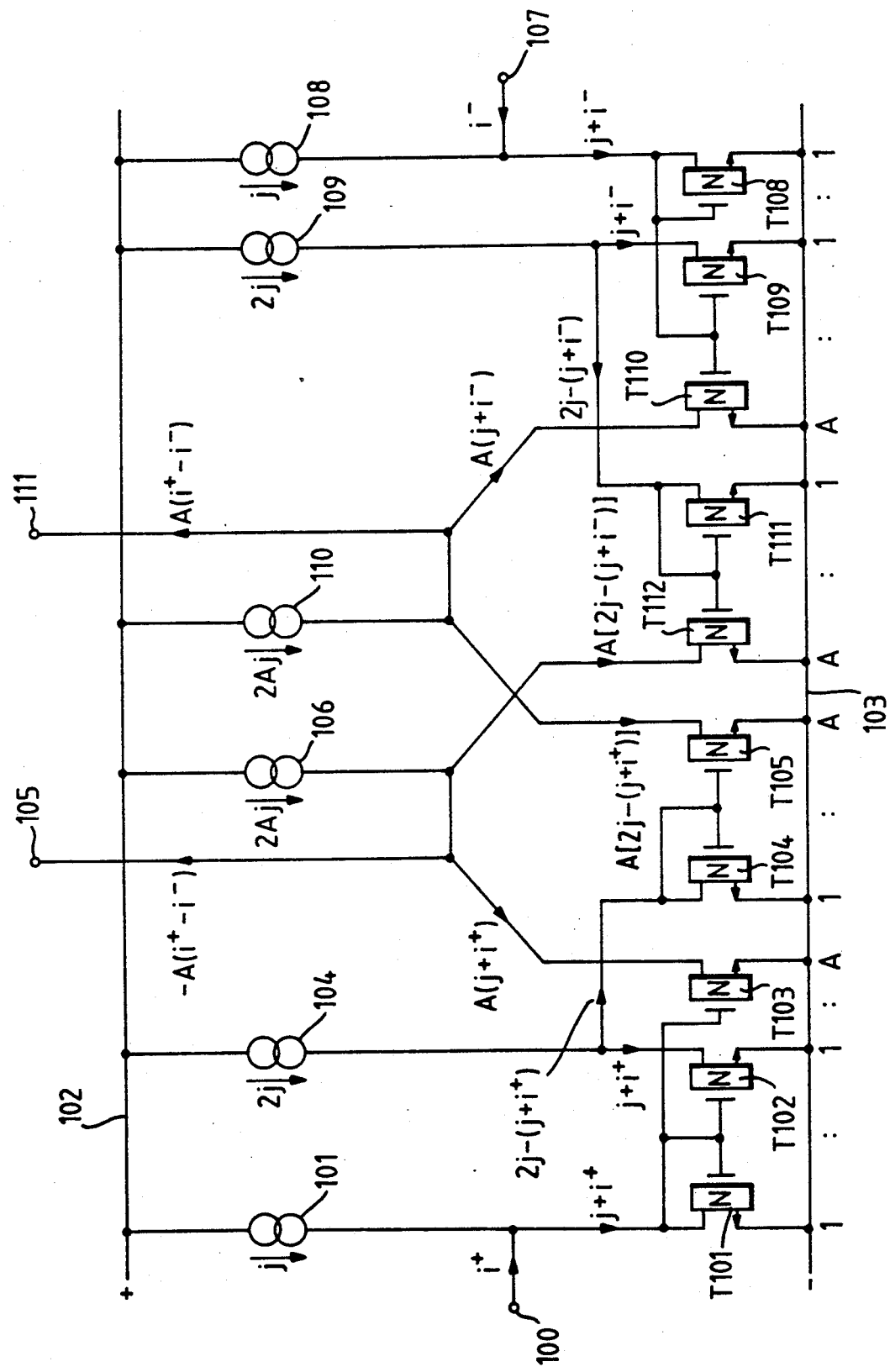
FIG. 6 shows a second embodiment of a circuit module for use in a circuit arrangement according to the invention.

The differential current scaling circuit shown in FIG. 6 has a first input 100 which is connected to the junction of a current source 101 and the drain electrode of an n-channel field effect transistor T101. The other end of the current source 101 is connected to a positive supply rail 102 while the source electrode of transistor T101 is connected to a negative supply rail 103. The drain electrode of transistor T101 is also connected to its gate electrode and to the gate electrodes of two further n-channel field effect transistors T102 and T103. A current source 104 is connected between the positive supply rail 102 and the drain electrode of transistor T102 and the drain and gate electrodes of an n-channel field effect transistor T104. The gate electrode of transistor T104 is connected to the gate electrode of a further n-channel field effect transistor T105. The source electrodes of transistors T102, T103, T104, and T105 are connected to the negative supply rail 103. The drain electrode of transistor T103 is connected to a first output terminal 105. A current source 106 is connected between the positive supply rail 102 and the drain electrode of transistor T103. A second input terminal 107 is connected to the junction of a current source 108 and the drain electrode of an n-channel field effect transistor T108. The other end of the current source 108 is connected to the positive supply rail 102 while the source electrode of transistor T108 is connected to the negative supply rail 103. The drain electrode of transistor T108 is further connected to its gate electrode and to the gate electrodes of two further n-channel field effect transistors T109 and T110. The source electrodes of transistors T109 and T110 are connected to the negative supply rail 103. The drain electrode of transistor T109 is connected to the positive supply rail 102 via a current source 109 and to the drain electrode of an n-channel field effect transistor T111. The drain electrode of transistor T110 is connected to the positive supply rail 102 via a current source 110 and to an output 111. The drain electrode of transistor T111 is connected to its gate electrode and to the gate electrode of an n-channel field effect transistor T112. The source electrodes of transistors T111 and T112 are connected to the negative supply rail 103. The drain electrode of transistor T105 is connected to the output 111 while the drain electrode of transistor T112 is connected to the output 105.

The current sources 101 and 108 both produce the current j, the current sources 104 and 109 both produce the current 2j, and the current sources 106 and 110 both produce the current 2Aj. Transistors T101 to T103 comprise a first n-channel current mirror circuit having an input branch comprising transistor T101, a first output branch comprising transistor T102 and a second output branch comprising transistor T103. The current ratio between the input and first output branch is 1:1, while that between the input and second output branch is 1:A. A second current mirror circuit is formed by transistors T104 and T105, the input branch comprising transistor T104 and the output branch comprising transistor T105. The current ratio between the input and output branches of the second current mirror circuit is 1:A. Similarly, the transistors T108, T109 and T110 form a third current mirror circuit having current ratios of 1:1 between the input and first output branch and 1:A between the input and second output branch. A fourth current mirror circuit is formed by transistors T111 and T112 which has a current ratio of 1:A between its input and output branches.

If a current i+ is applied to input 100 and a current i− to input 107, then the currents labelled on FIG. 6 will be produced. By following through these currents it can be seen that at outputs 105 and 111 the current −A(i+ −i−) and A(i+ −i−) are produced.

Various fully differential static modules performing scaling functions can be produced using n-channel current mirror circuits. The person skilled in the art will be able to derive constructions using current mirror circuits containing n-channel devices equivalent to those constructions disclosed in U.S. Pat. No. 4,958,123 which use both current mirror circuits containing n-channel devices and current mirror circuits containing p-channel devices.

Figure 7:
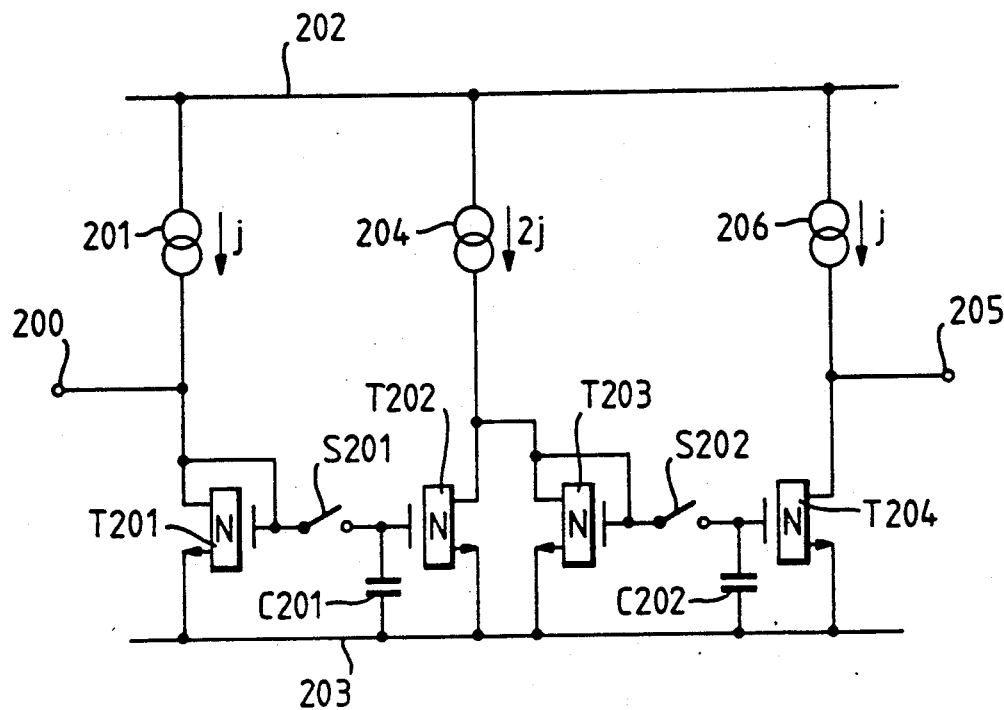
FIG. 7 shows a third embodiment of a circuit module for use in a circuit arrangement according to the invention.

FIG. 7 shown a current memory module constructed using current memory cells which employ n-channel field effect transistors only. The current memory module shown in FIG. 7 has an input 200 which is connected to the junction of a current source 201 and the drain electrode of an n-channel field effect transistor T201. The other end of the current source 201 is connected to a positive supply rail 202 while the source electrode of transistor T201 is connected to a negative supply rail 203. The drain electrode of transistor T201 is further connected to its gate electrode and to one end of a switch S201. The other end of the switch S201 is connected to the junction of a capacitor C201 and the gate electrode of an n-channel field effect transistor T202. The other end of the capacitor C201 and the source electrode of transistor T202 are connected to the negative supply rail 203. The drain electrode of transistor T202 is connected to the positive supply rail 202 via a current source 204. The junction of the current source 204 and the drain electrode of transistor T202 is connected to the drain and gate electrodes of an n-channel field effect transistor T203. The source electrode of transistor T203 is connected to the negative supply rail 203 while its gate electrode is conected to one end of a switch S202. The other end of the switch S202 is connected to the junction of a capacitor C202 and the gate electrode of an n-channel field effect transistor T204. The source electrode of transistor T204 and the other end of the capacitor C202 are both connected to the negative supply rail 203. The drain electrode of transistor T204 is connected to an output 205 and to the positive supply rail 202 via a current source 206. The current sources 201 and 206 produce the current j while the current source 204 produces the current 2j. The switches S201 and S202 are controlled by two clock phases $\hat{\phi}$ and $\phi$ which occur during each sampling period $P_n$. The clock phases $\hat{\phi}$ and $\phi$ are non-overlapping so that the switches S201 and S202 are never both closed at the same time.

The operation of the current memory circuit is as follows. If, during a period $P_n$ an input current $i_n$ is applied at input 200, then the current $i_n+j$ is applied to the diode connected transistor T201. When the switch S201 is closed, that is during the $\hat{\phi}$ phase, then the circuit comprising transistors T201 and T202 is effectively a current mirror circuit and the transistor T202 will conduct the current $j+i_n$. At the same time the capacitor C201 will be charged to the gate-source potential of transistor T202 and thus when the switch S201 opens the charge on capacitor C201 will maintain the gate-source potential of transistor T202 so that it continues to conduct the current $j+i_n$. As a result the current $2j-(j+i_n)$ will be applied to the diode connected transistor T203. During the $\phi$ phase of the sampling period $P_{n+1}$, the switch S202 will be closed and hence the current conducted by transistor T204 will be equal to $2j-(j+i_n)$ and the capacitor C202 will become charged to the gate source potential of transistor T204. When the switch S202 opens, that is after the end of the $\phi$ phase of sampling period $P_{n+1}$, the current through transistor T204 will be maintained at the value $2j-(j+i_n)$ and hence the output current will be equal to $i_n$, that is the output current is equal to the input current in the preceding sampling period.

Figure 8:
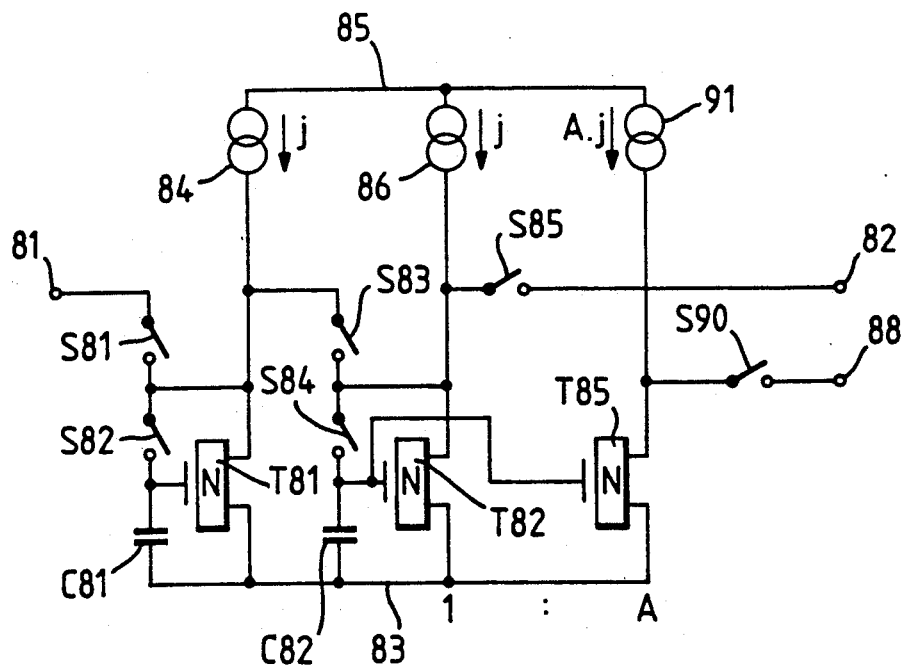
FIG. 8 shows a fourth embodiment of a circuit module for use in a circuit arrangement according to the invention.

FIG. 8 shows an alternative current memory circuit using only n-channel field effect transistors. The current memory circuit shown in FIG. 8 has an input 81 which is connected to one end of a switch S81 whose other end is connected to the junction of one end of a switch S82 and the drain electrode of an n-channel field effect transistor T81. The other end of the switch S82 is connected to the junction of the gate electrode of transistor T81 and a capacitor C81. The other end of the capacitor C81 and the source electrode of transistor T81 are connected to a negative supply rail 83. The drain electrode of transistor T81 is connected to a positive supply rail 85 via a current source 84. One end of a switch S83 is connected to the junction of the current source 84 and the drain electrode of transistor T81. The other end of switch S83 is connected to the junction of one end of a switch S84 and the drain electrode of an n-channel field effect transistor T82. The other end of switch S84 is connected to the junction of the gate electrode of transistor T82 and a capacitor C82. The other end of capacitor C82 and the source electrode of transistor T82 are connected to the negative supply rail 83. The drain electrode of transistor T82 is connected to the positive supply rail 85 via a current source 86 and to one end of a switch S85, the other end of which is connected to an output 82. The gate electrode of transistor T82 is connected to the gate electrode of an n-channel field effect transistor T85 whose source drain electrode is connected to the negative supply rail 83 and whose drain electrode is connected to the positive supply rail by a current source 91. The drain electrode of transistor T85 is also connected to an output 88 via a switch S90. The current sources 84 and 86 both each produce the current j while the current source 91 produces the current A.j. These currents are appropriate if the channel width to length ratios of transistors T85 and T82 are chosen so that transistor T85 conducts A times the current conducted by transistor T82 when the same gate-source voltage is applied.

Two non-overlapping clock signals $\phi$ and $\hat{\phi}$ are produced to control the switches S81 and S85 and S90. Thus each sampling period $P_n$ is divided into a $\phi$ phase and a $\hat{\phi}$ phase which do not overlap. The arrangement shown in FIG. 8 operates as follows. If an input current $i_n$ is applied to the input 81 in a sampling period $P_n$, then during phase $\phi$ the switches S81 and S82 are closed and the switch S83 is open. Consequently, transistor T81 is connected as a diode and the capacitor C81 becomes charged to the gate-source potential produced by the current $i_n+j$ flowing through transistor T81. At the end of the $\phi$ phase switches S81 and S82 open but the transistor T81 continues to conduct the current $j+i_n$ because of the charge on capacitor C81. In the $\hat{\phi}$ phase of sampling period $P_n$ switches S83 and S84 close and the transistor T82 is connected as a diode and conducts the current $j+i_n$. Again the capacitor C82 becomes charged to the gate-source potential of transistor T82 and thus at the end of the $\hat{\phi}$ phase the current through transistor T82 is maintained by $j+i_n$ by the charge on capacitor C82. Also, since the gate electrode of transistor T85 is connected to the gate electrode of transistor T82 the transistor T85 conducts the current $A\times(j+i_n)$. During the $\phi$ phase of the next sampling period $P_{n+1}$ switches S85 and S90 close and consequently the current $i_n$ is produced at terminal 82 and the current $A.i_n$ is produced at the terminal 88. Thus the memory circuit shown in FIG. 8 is capable of reproducing at its output 82 the current applied to its input 81 in the previous sampling period and at the output 88 a scaled version of that current is available.

Clearly, fully differential versions of the memory circuit shown in FIG. 8 could readily be designed by the person skilled in the art and reference should be made to U.S. Pat. No. 4,958,123 the various type of memory circuit which can be constructed using complementary current memory cells, and these may all be transformed into memory circuits using memory cells having n-channel field effect transistors only.

Figure 9:
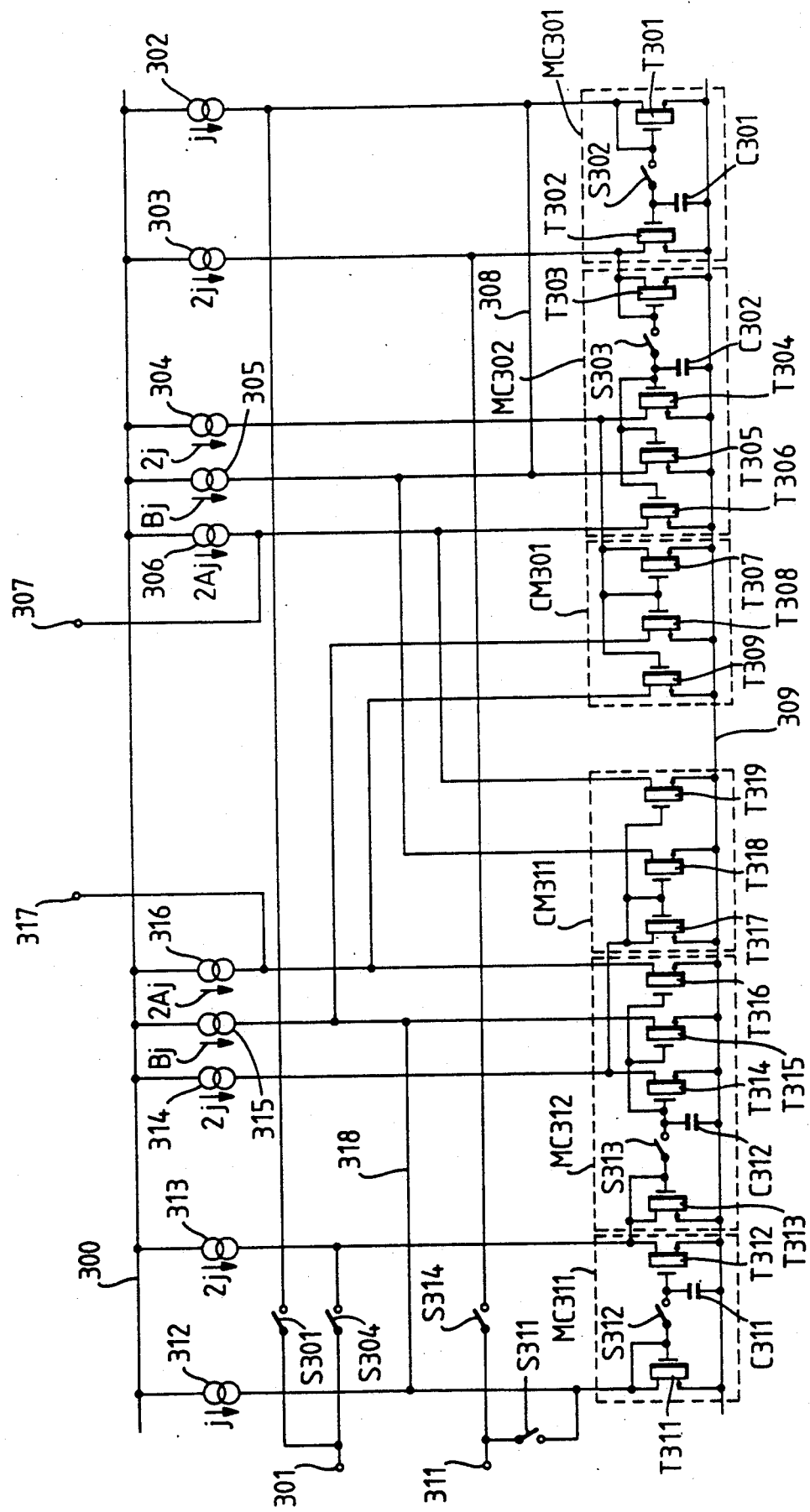
FIG. 9 shows a fifth embodiment of a circuit module for use in a circuit arrangement according to the invention.

FIG. 9 shows a double balanced differential bilinear integrator in which signal currents flow only through n-channel field effect transistors. The circuit shown in FIG. 9 has two input terminals 301 and 311. The input terminal 301 is connected via a switch S301 to the junction of a current source 302 and a drain electrode of an n-channel field effect transistor T301. The other end of the current source 302 is connected to a positive supply rail 300 while the source electrode of transistor T301 is connected to a negative supply rail 309. The drain electrode of transistor T301 is further connected to its gate electrode and to one end of a switch S302. The other end of the switch S302 is connected to the junction of a capacitor C301 and the gate electrode of an n-channel field effect transistor T302. The other end of the capacitor C301 and the source electrode of transistor T302 are connected to the negative supply rail 309. The drain electrode of transistor T302 is connected via a current source 303 to the positive supply rail 300 and to the drain electrode of an n-channel field effect transistor T303. The drain electrode of transistor T303 is also connected to its gate electrode and to one end of a switch S303, while its source electrode is connected to the negative supply rail 309. The other end of the switch S303 is connected to the junction of a capacitor C302 and the gate electrodes of three n-channel field effect transistors T304, T305 and T306. The other end of capacitor C302 and the source electrodes of transistors T304, T305 and T306 are all connected to the negative supply rail 309. The drain electrode of transistor T304 is connected via a current source 304 to the positive supply rail 300, the drain electrode of transistor T305 is connected to a positive supply rail via a current source 305, and the drain electrode of transistor T306 is connected to the positive supply rail 300 by a current source 306. The drain electrode of transistor T304 is further connected to the drain electrode of an n-channel field effect transistor T307 whose source electrode is connected to the negative supply rail 309. The drain electrode of transistor T307 is further connected to its gate electrode and to the gate electrodes of two further n-channel field effect transistors T308 and T309. The source electrodes of transistors T308 and T309 are connected to the negative supply rail 309 while the drain electrodes of transistors T308 and T309 are connected to the positive supply rail 300 via respective current sources 315 and 316.

Input terminal 311 is connected by a switch S311 to the junction of a current source 312 and the drain electrode of an n-channel field effect transistor T311. The other side of the current source 312 is connected to the positive supply rail 300 while the source electrode of transistor T311 is connected to the negative supply rail 309. The drain electrode of transistor T311 is further connected to its gate electrode and to one end of a switch S312. The other end of the switch S312 is connected to the junction of a capacitor C311 and the gate electrode of an n-channel field effect transistor T312.

The other end of the capacitor C311 and the source electrode of the transistor T312 are both connected to the negative supply rail 309. The drain electrode of transistor T312 is connected to the positive supply rail 300 via a current source 313 and to the drain electrode of an n-channel field effect transistor T313 whose source electrode is connected to the negative supply rail 309. The drain electrode of transistor T313 is further connected to its gate electrode and to one end of a switch S313. The other end of switch S313 is connected to the junction of a capacitor C312 and the gate electrode of an n-channel field effect transistor T314. The other end of the capacitor C312 and the source electrode of transistor T314 are connected to the negative supply rail 309. The gate electrode of transistor T314 is further connected to the gate electrodes of two n-channel field effect transistors T315 and T316 whose source electrodes are connected to the negative supply rail 309. The drain electrodes of transistors T315 and T316 are connected to the positive supply rail 300 via current sources 315 and 316, respectively. The drain electrode of transistor T314 is connected to the positive supply rail 300 via a current source 314 and to the drain electrode of an n-channel field effect transistor T317. The drain electrode of transistor T317 is connected to its gate electrode and to the gate electrodes of two further n-channel field effect transistors T318 and T319. The source electrodes of transistors T317, T318 and T319 are connected to the negative supply rail 309. The drain electrodes of transistors T318 and T319 are connected to the positive supply rail 300 via current sources 305 and 306 respectively. An output terminal 307 is connected to the junction of the current source 306 and the drain electrode of transistor T306, while an output terminal 317 is connected to the junction of a current source 316 and the drain electrode of the transistor T316. A feedback connection 308 is provided between the drain electrode of transistor T305 and the drain electrode of transistor T301, while a feedback connection 318 is connected between the drain electrode of transistor T315 and the drain electrode of transistor T311. The input terminal 301 is further connected by a switch S304 to the junction of the current source 313 and the drain electrode of transistor T312, while the input terminal 311 is further connected through a switch S314 to the junction of a current source 303 and the drain electrode of transistor T302.

Figure 10:
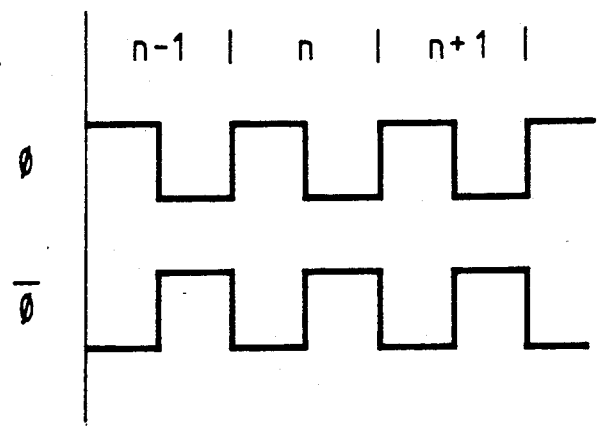
FIG. 10 is a timing diagram illustrating waveforms for operating switches in the circuit arrangement during each sampling period.

The transistors T301, T302, the capacitor C301 and the switch S302 form a first current memory cell MC301 having a unity current ratio, i.e. The output current in one clock period is equal to the input current in the preceding clock period. The transistors T303 to T306, the switch S303 and the capacitor C302 form a second current memory cell MC302. The second current memory cell MC302 has three outputs taken from the drain electrodes of transistors T304, T305 and T306 respectively. The output from the drain electrode of transistor T304 has the same value as the current previously applied to the drain electrode of transistor T303. The current produced by transistor T305 is equal to B/2 times the current previously applied to the drain electrode of transistor T303 while the drain electrode of transistor T306 produces an output current equal to A times the current previously applied to the drain electrode of transistor T303. The transistors T311 and T312, the capacitor C311 and the switch S312 form a third current memory cell MC311 having a unity current ratio. The output of the third current memory cell is derived from the drain electrode of transistor T312 which produces a current equal to that previously applied to the drain electrode of transistor T311. The transistors T313, T314, T315 and T316, the capacitor C312 and the switch S313 form a fourth current memory cell MC312. The current produced at the drain electrode of transistor T314 is equal to the current previously applied to the drain electrode of transistor T313, the current produced at the drain electrode of transistor T315 is equal to B/2 times the current previously applied to the drain electrode of transistor T313 and the current produced at the drain electrode of transistor T316 is equal to A times the current previously applied to the drain electrode of transistor T313. The transistors T307, T308 and T309 form a first current mirror circuit CM301. The channel width/length ratios of the transistors are selected so that the current produced at the drain electrode of transistor T308 is equal to B/2 times the current applied to the drain electrode of transistor T307 while the current produced at the drain electrode of transistor T309 is equal to A times the current applied to the drain electrode of transistor T307. Transistors T317, T318 and T319 form a second current mirror circuit CM311. The current produced by transistor T318 is equal to B/2 times the current applied to transistor T317 while the current produced by transistor T319 is equal to A times the current applied to transistor T317. The current sources 302 and 312 each produce a current j, the current sources 303, 304, 313 and 314 all produce the current 2j, the current soures 305 and 315 each produce the current Bj, while the current sources 306 and 316 each produce the current 2Aj. The switches S301, S302, S311 and S312 are closed during the $\hat{\phi}$ phase while the switches S304, S303, S314 and S313 are closed during the $\phi$ phase; the $\phi$ and $\hat{\phi}$ phases being as defined in FIG. 10.

The operation of the integrator shown in FIG. 9 will be described using the assumption that the input terminals 301 and 311 receive differential input currents $i^+$ and $i^-$ respectively and that the output of terminals 317 and 307 produce the output differential currents $i_o^+$ and $i_o^-$ respectively. In the following analysis the currents $I_1$ to $I_9$ are defined as the currents flowing through transistors T311 to T319, respectively, while the current $I_1'$ to $I_9'$ are defined as the currents flowing through transistors T301 to transistors T309, respectively.

During the $\hat{\phi}$ phase of sampling period (n−1)

$$I_1 = I_2 = j + i^- + i_f$$

where $i_f = i_o^+(n-1)/2A$ $$i^- = i^-(n-1)$$

and, for an ideal integrator $$B = 1$$

$$I_2 = j + i_o^+(n-1)/2A + i^-(n-1)$$

Similarly $I_2' = j + i_o^-(n-1)/2A + i^+(n-1)$
During the $\phi$ phase of sampling period n $$I_3 = I_4 = 2I_5 = I_6/A$$

-continued $$I_4 = 2j + i^-(n) - I_2$$
$$= 2j + i^+(n) - [j + i_o^+(n - 1)/2A + i^-(n - 1)]$$
$$= j + i^+(n) - i_o^+(n - 1)/2A + i^-(n - 1)$$
$$I_6 = A[j + i^+(n) - i_o^+(n - 1)/2A + i^-(n - 1)]$$
$$I_7 = 2I_8 = I_9/A$$
$$= 2j - I_4$$
$$= 2j - [j + i^+(n) - i_o^+(n - 1)/2A + i^-(n - 1)]$$
$$= j - i^+(n) + i_o^+(n - 1)/2A + i^-(n - 1)$$
$$I_9 = A[j - i^+(n) + i_o^+(n - 1)/2A + i^-(n - 1)]$$

Similarly
$$I_6' = A[j + i^-(n) - i_o^-(n - 1)/2A - i^+(n - 1)]$$
$$I_9' = A[j - i^-(n) + i_o^-(n - 1)/2A + i^+(n - 1)]$$
$$i_o^+ = 2Aj - [I_6 + I_9']$$
$$= 2Aj - A[j + i^+(n) - i_o^+(n - 1)/2A - i^-(n - 1) + j - i^-(n) + i_o^-(n - 1)/2A + i^+(n - 1)]$$
$$= -A[i^+(n) - i^-(n) + i^+(n - 1) - i^-(n - 1)] + i_o^+(n - 1)/2 - i_o^-(n - 1)/2$$
$$= i_o(n - 1)/2 - A[i(n) + i(n - 1)]$$

where $i_n = (i_n^+ - i_n^-)$ $$i_o = (i_o^+ - i_o^-)$$
$$i_o^- = 2Aj - [I_6' + I_9]$$
$$= 2Aj - A[j + i^-(n) - i_o^-(n-1)/2A - i^+(n - 1) + j - i^+(n) + i_o^+(n-1)/2A + i^-(n - 1)]$$
$$= -i_o(n - 1)/2 + A[i(n) + i(n - 1)]$$
$$= -i_o^+$$
$$i_o(n) = i_o^+ - i_o^-$$
$$= 2i_o^+ = i_o(n - 1) - 2A[i(n) + i(n - 1)]$$

Converting to the z domain $$i_o(z) = i_o(z).z^{-1} - 2A[i(z) + i(z).z^{-1}]$$

$$H(z) = i_o(z)/i(z) = -2A(1 + z^{-1}/1 - z^{-1})$$

Mapping onto the continuous time ideal integrator $$A = T/4$$

If B is made to be less than one a lossy integrator is formed, whereas if B is equal to one an ideal integrator is formed. Various filter bi-quadratic sections employ both ideal and lossy integrators, for example, the Tow-Thomas bi-quadratic section.

Figure 11:
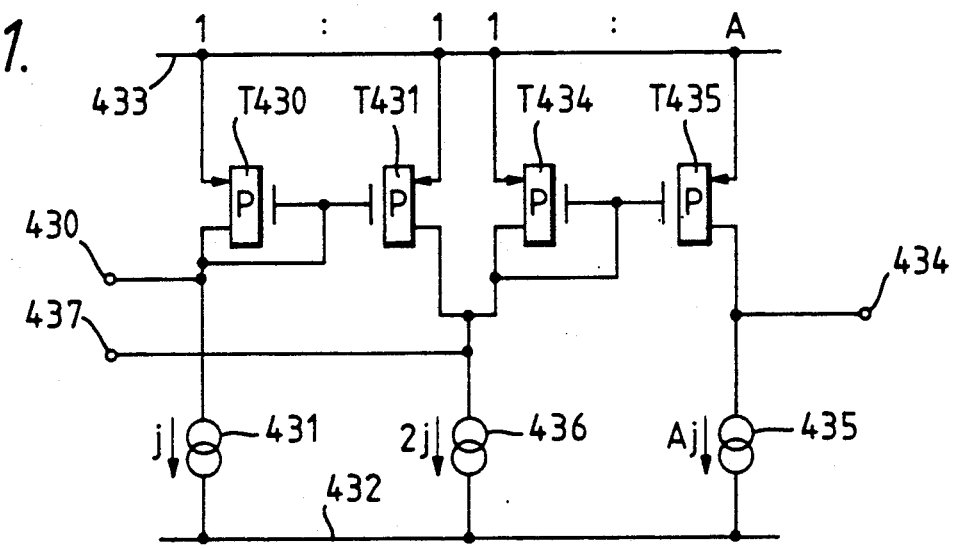
FIG. 11 shows a sixth embodiment of a circuit module for use in a circuit arrangement according to the invention.

FIG. 11 shows a sixth embodiment of a circuit module for use in a circuit arrangement according to the invention, the module in FIG. 11 being of the same form as at that shown in FIG. 3 except that p-channel field effect transistors are used for conducting signal currents rather than n-channel field effect transistors. In the form shown in FIG. 11 the circuit module performs a subtracting scaler function. The circuit module shown in FIG. 11 has an input terminal 430 which is connected to the junction of the drain electrode of a p-channel field effect transistor T430 and a current source 431. The other end of the current source 431 is connected to a negative supply rail 432 while the source electrode of transistor T430 is connected to a positive supply rail 433. The drain electrode of transistor T430 is connected to its gate electrode and to the gate electrode of a p-channel field effect transistor T431 whose source electrode is connected to the positive supply rail 433. The drain electrode of transistor T431 is connected to the negative supply rail 432 via a current source 436. An input terminal 437 is connected to the drain electrode of transistor T431 and to the drain electrode of a p-channel field effect transistor T434. The source electrode of transistor T434 is connected to the positive supply rail 433 while its drain electrode is connected to its gate electrode and to the gate electrode of a p-channel field effect transistor T435. The source electrode of transistor T435 is connected to the positive supply rail 433 while its drain electrode is connected to an output terminal 434 and via a current source 435 to the negative supply rail 432. The current source 431 is arranged to conduct a current of j, the current source 436 is arranged to conduct a current 2j, and the current source 435 is arranged to conduct a current Aj. The first current mirror circuit formed by transistor T430 and transistor T431 is arranged to have a unity current ratio, while the second current mirror circuit formed by transistors T434 and T435 is arranged to have a current ratio 1 to A.

In operation an input current $i_1$ is connected to input 430 and as a result the current $j+i_1$ is connected to the input of the first current mirror circuit. Consequently, the output of the first current mirror circuit is also $j+i_1$. If an input current $i_2$ is fed to terminal 437 then the current fed to the input of the second current mirror circuit will be equal to $2j+i_2-(j+i_1)$ which is equal to $j+i_2-i_1$. This causes the second current mirror circuit to produce the current $A(j+i_2-i_1)$ at its output. Consequently the current at output 434 is equal to $Aj-A(j+i_2-i_1)$ which is equal to $A(i_1-i_2)$. Consequently, the output at terminal 434 is equal to the difference between the input currents applied to input terminals 430 and 437 multiplied by a constant A. If a plurality of outputs are required then all that is needed to enable their production is the addition of further branches in the output circuit of the second current mirror and appropriate current sources equivalent to the current source 435. The further output branches and corresponding current sources may, of course, have different scaling factors. In that way a number of independently scaled outputs may be produced. A summing scaler can be conveniently produced merely by providing a number of inputs at the junction between the drain electrode of transistor T430 and the current source 431. The number of summing inputs is restricted by the condition that the total current flowing into the junction between the drain electrode of transistor T430 and the current source 431 must not be allowed to become greater than the current j.

Figure 12:
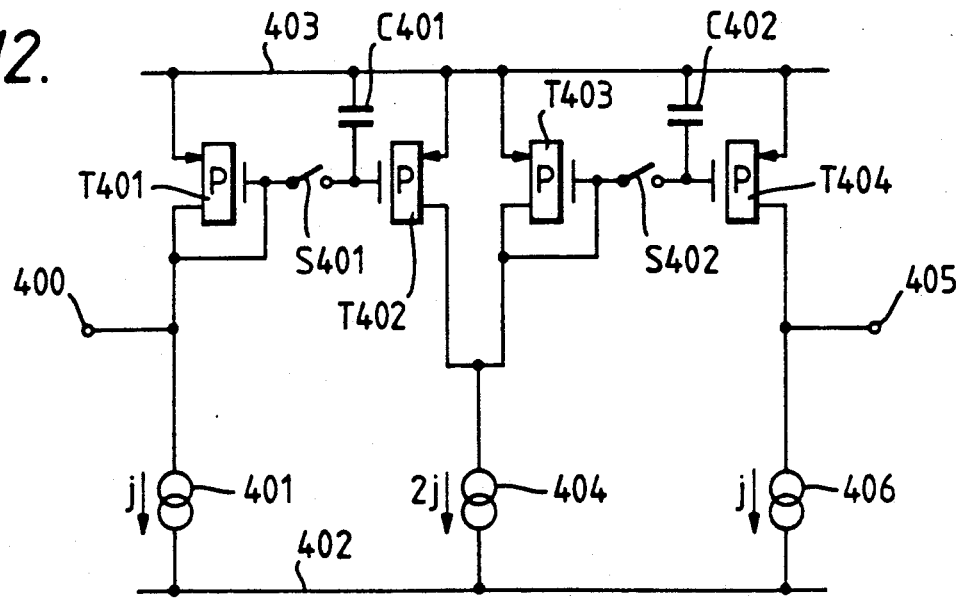
FIG. 12 shows a seventh embodiment of a circuit module for use in a circuit arrangement according to the invention.

FIG. 12 shows a seventh embodiment of a circuit module for use in a circuit arrangement according to the invention and which takes the form of a current memory circuit. This circuit is equivalent to that shown in FIG. 7 but uses p-channel field effect transistors for conducting signal currents rather than n-channel field effect transistors. The current memory circuit shown in FIG. 12 has an input 400 which is connected to the drain electrode of a p-channel field effect transistor T401 and a current source 401. The source electrode of transistor T401 is connected to the positive supply rail 403 while the other end of the current source 401 is connected to a negative supply rail 402. The drain electrode of transistor T401 is connected to its gate electrode and to one end of a switch S401. The other end of the switch S401 is connected to the junction of a capacitor C401 and the gate electrode of a p-channel field effect transistor T402. The other end of capacitor C401 is connected to the positive supply rail. The drain electrode of transistor T402 is connected via a current source 404 to the negative supply rail 402, while its source electrode is connected to the positive supply rail 403. Th drain electrode of transistor T402 is connected to the drain electrode of a p-channel field effect transistor T403 whose source electrode is connected to the positive supply rail 403. The gate electrode of transistor T403 is connected to its drain electrode and to one end of a switch S402. The other end of switch S402 is connected to the junction of the gate electrode of p-channel field effect transistor T404 and to a capacitor C402 whose other end is connected to the positive supply rail 403. The source electrode of transistor T404 is connected to the positive supply rail 403 while its drain electrode is connected to an output 405 and via a current source 406 to the negative supply rail 402. The switches S401 and S402 are controlled by two clock phases $\bar{\phi}$ and $\phi$ which occur during each sampling period Pn. The clock phases $\bar{\phi}$ and $\phi$ are non-overlapping so that the switches S401 and S402 are never both closed at the same time.

The operation of the current memory circuit shown in FIG. 12 is similar to described with reference to FIG. 7. Consequently, the operation will not be further described.

Figure 13:
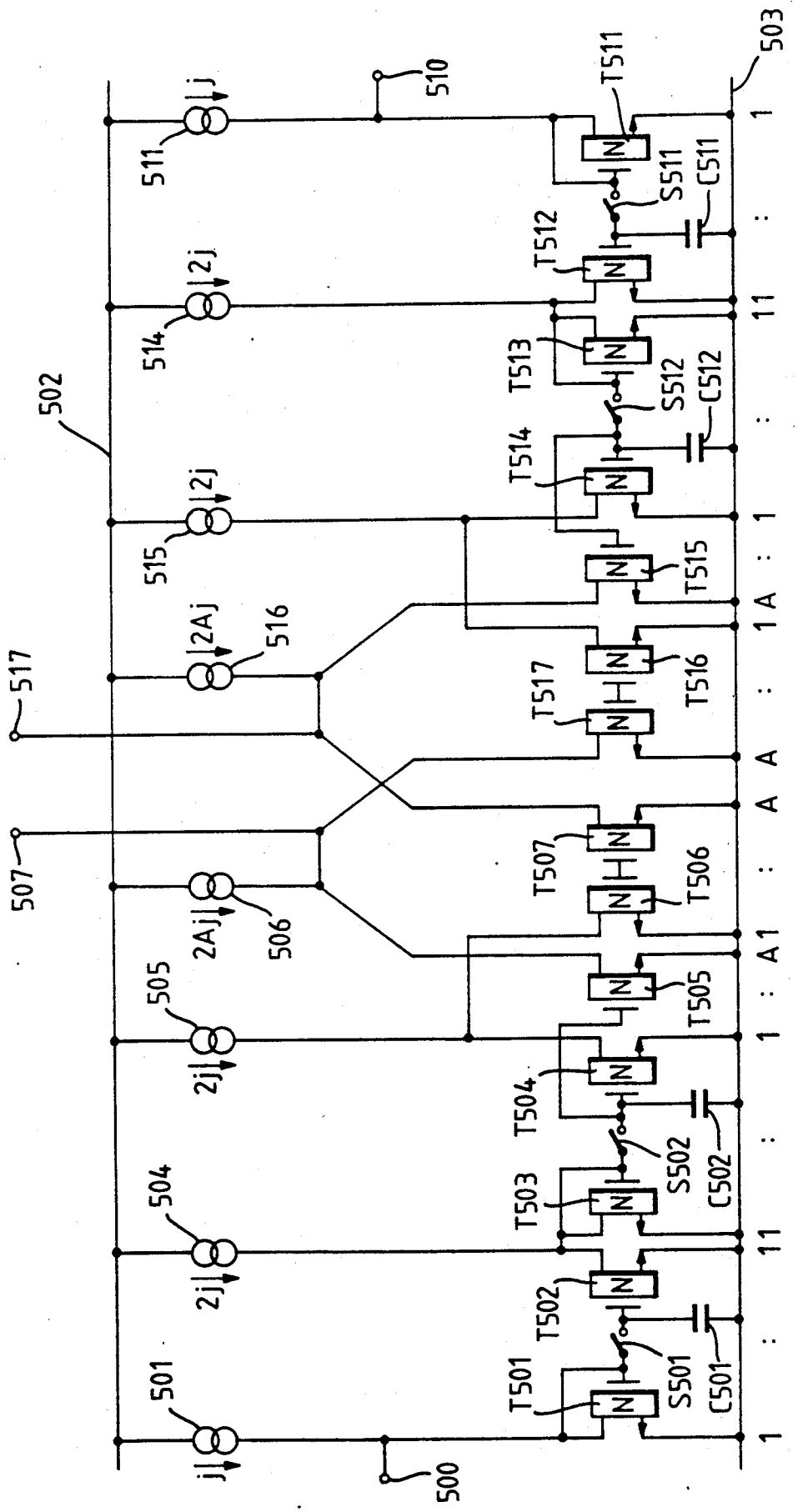
FIG. 13 shows an eighth embodiment of a circuit module for use in a circuit arrangement according to the invention.

FIG. 13 shows an eighth embodiment of a circuit module for use in a circuit arrangement according to the invention. The module shown in FIG. 13 takes the form of a current memory having a differential current input and a differential current output. The module shown in FIG. 13 has first and second input terminals 500 and 510 for the application of a differential input current. The input terminal 500 is connected to the junction of the drain electrode of an n-channel field effect transistor T501 and a current source 501. The other end of the current source 501 is connected to a positive supply rail 502 while the source electrode of transistor T501 is connected to a negative supply rail 503. The drain electrode of transistor T501 is connected to its gate electrode and to one end of a switch S501. The other end of the switch S501 is connected to the gate electrode of an n-channel field effect transistor T502 and to a capacitor C501 whose other end is connected to the negative supply rail 503. The source electrode of transistor T502 is connected to the negative supply rail 503 while its drain electrode is connected to the drain and gate electrodes of an n-channel field effect transistor T503 and via a current source 504 to the positive supply rail 502. The gate electrode of transistor T503 is connected to one end of a switch S502, while its source electrode is connected to the negative supply rail 503. The other end of the switch S502 is connected to the gate electrodes of two further n-channel field effect transistors T504 and T505 and to a capacitor C502 whose other end is connected to the negative supply rail 503. The drain electrode of transistor T504 is connected to the drain electrode of an n-channel field effect transistor T506 and via a current source 505 to the positive supply rail 502. The source electrodes of transistors T504, T505 and T506 are connected to the negative supply rail 503. The drain electrode of transistor T505 is connected to the positive supply rail 502 via a current source 506 and to an output terminal 507.

The input terminal 510 is connected to the junction of a current source 511 and the drain electrode of an n-channel field effect transistor T511. The source electrode of transistor T511 is connected to the negative supply rail 503 while the other end of the current source 511 is connected to the positive supply rail 502. The drain electrode of transistor T511 is connected to its gate electrode and to one end of a switch S511. The other end of the switch S511 is connected to the gate electrode of an n-channel field effect transistor T512 and to a capacitor C511 whose other end is connected to the negative supply rail 503. The drain electrode of transistor T512 is connected to the drain and gate electrodes of an n-channel field effect transistor T513 and to the positive supply rail via a current source 514. The source electrodes of transistors T512 and T513 are connected to the negative supply rail. The gate electrode of transistor T513 is connected to one end of a switch S512 whose other end is connected to the gate electrodes of two n-channel field effect transistors T514 and T515 and to one end of a capacitor C512 whose other end is connected to the negative supply rail 503. The drain electrode of transistor T514 is connected to the drain electrode of a further n-channel field effect transistor T516 and via a current source 515 to the positive supply rail 502. The drain electrode of transistor T515 is connected to the positive supply rail 502 via a current source 516 and to an output terminal 517. The source electrodes of transistors T514, T515 and T516 are connected to the negative supply rail 503.

The gate electrode of transistor T506 is connected to its drain electrode and to the gate electrode of an n-channel field effect transistor T507. The source electrode of transistor T507 is connected to the negative supply rail 503 while its drain electrode is connected to the terminal 517. The gate electrode of transistor T516 is connected to its drain electrode and to the gate electrode of an n-channel field effect transistor T517. The source electrode of transistor T517 is connected to the negative supply rail 503 while and its drain electrode is connected to the output terminal 507.

The operation of the differential current memory shown in FIG. 13 can be analysed in a manner similar to that of the operation of the differential scaling circuit shown in FIG. 6. The first current memory circuit formed by transistors T501 to T505 together with their associated switches and capacitors is equivalent to the first current mirror circuit in FIG. 6 formed by transistors T101 to T103. Similarly the current memory circuit formed by transistors T511 to T515 and their associated switches and capacitors is equivalent to the current mirror circuit in FIG. 6 formed by transistors T108 to T110. The current mirror circuit formed by transistors T506 and T507 and by transistors T517 and T516 are equivalent to the current mirror circuits in FIG. 6 formed by transistors T104 and T105 and by transistors T111 and T112. However, due to the action of the current memory circuit the currents produced at the output terminals 507 and 517 are related to the currents applied to the input terminals 500 and 510 in the previous clock cycle. Thus, the appearance of the current applied to terminals 500 and 510 at the output terminals 507 and 517 is delayed by a clock period. It should also be noted that the currents are inverted a further time in the current memory circuit as compared with the input current mirror circuit in FIG. 6 so that the output at terminal 507 is equal to A (i+ −i−) and that at terminal 507 is equal to −A (i+ −1−).

Clearly a fan-out capacity can be added to the differential current memory circuit shown in FIG. 13 by adding further output branches to the current memory circuits and by adding appropriate further output branches to the current mirror circuits. Thus a current memory having a fan-out capacity can be provided.

It should be noted that the capacitors in any of the current memory circuits disclosed herein can be connected between the gate electrode of the respective transistor and any point of fixed potential. In particular it is not necessary to connect the capacitor between the gate and source electrodes of the transistor. It is only necessary that the capacitor is able to store a charge which is dependent on the input current and maintain a gate voltage which maintains the output current when the associated switch is open. Clearly the most convenient points of fixed potential are the positive and negative supply rails, but if any other fixed voltages are generated in or supplied to the circuit they could equally be used.

It will be clearly apparent to those skilled in the art that any of the circuit modules described herein may be implemented using either p-channel or n-channel field effect transistors for conducting signal currents. The modifications to any of the circuits shown to provide for the appropriate polarity devices will be clearly apparent to the person skilled in the art. Further, the various circuits shown in U.S. Pat. No. 4,958,123 may be implemented using either n-channel field effect transistors only or p-channel field effect transistors only for conducting signal currents. The required modifications to these circuits within the scope of the person skilled in the art. Reference may be made to the aforementioned U.S. patent for further details of various circuit modules which may be produced.

From reading the present disclosure, other modifications will be apparent to persons skilled in the art. Such modifications may involve other features which are already known in the design and use of electrical or electronic circuits and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any modification of one or more of those features which would be obvious to persons skilled in the art, whether or not it relates to the same invention as presently claimed in any claim and whether or not it mitigates any or all of the same technical problems as does the present invention.

I claim:

1. A circuit arrangement for processing sampled analogue electrical signals, each sample being in the form of a current, the circuit arrangement comprising; means for combining, in predetermined proportions, an input sample current in a present sample period with current(s) derived from input sample current(s) in one or more preceding sample periods, and means for deriving a processed output signal from a combined current produced by the combining means in successive sample periods, wherein the circuit arrangement comprises transistors and all of the transistors which conduct signal currents comprise devices of the same polarity.

2. A circuit arrangement as claimed in claim 1, wherein the transistors which carry signal currents comprise n-channel field effect transistors.

3. A circuit arrangement as claimed in claim 1, comprising a plurality of circuit modules, each circuit module having a current input for receiving a bi-directional input signal current and a current output for supplying a bi-directional output signal current, means for adding a bias current to the bi-directional input signal current to produce a unidirectional current for processing by the circuit module, and means for subtracting a suitably scaled bias current from the processed unidirectional current to produce a bidirectional output signal current.

4. A circuit arrangement as claimed in claim 3, wherein one of the circuit modules comprises a current memory module which is capable of reproducing at its output in one sampling period a scaled version of a current applied to its input in a previous sampling period.

5. A circuit arrangement as claimed in claim 4, wherein the current memory module comprises a current input, a current output, first and second switches controlled by first and second non-overlapping clock signals, and first and second memory cells, each memory cell comprising a field effect transistor having a capacitor connected between its gate and source electrodes, wherein the current input is coupled to the first memory cell by means of the first switch and the first memory cell is coupled to the second memory cell by means of the second switch, an output of the second memory cell being coupled to the current output.

6. A circuit arrangement as claimed in claim 4 wherein the current memory module includes a first memory cell having an input, an output, means comprising a first switch which is conductive during a first portion of a sample period for connecting the input of the first memory cell to a main current conducting path of a transistor, means comprising a second switch which is conductive during the first portion for connecting a junction of the first switch and the main current conducting path of the transistor to a current maintaining means, and means for connecting the main current conducting path of the transistor to the output of the first memory cell during a second portion of the sampling period, a second memory cell having an input coupled to the output of the first memory cell and an output coupled to the output of the current memory module, and means for coupling the input of the current memory module to the input of the first memory cell, wherein the means for connecting the main current conducting path of the transistor to the output of the first memory cell comprises a third switch which is conductive during a second portion of the sampling period which does not overlap the first portion, an output current from the first memory cell being available when the third switch is conductive.

7. A circuit arrangement as claimed in claim 4 wherein the current memory module has differential inputs and outputs and comprises a plurality of current memory cells, means for coupling each of the differential inputs to a respective current memory cell and means for combining outputs of selected memory cells for application to the differential current outputs.

8. A circuit arrangement as claimed in claim 3 including an integrator circuit module which is capable of integrating a bidirectional current applied to its input.

9. A circuit arrangement as claimed in claim 8 wherein the integrator circuit module comprises a current memory module as claimed in claim 4 and a feedback loop from a stored current output to a summing arrangement so that a stored current can be added to each current input sample.

10. A circuit arrangement as claimed in claim 9 connected so as to integrate differential input currents.

11. A circuit arrangement as claimed in claim 1, comprising a static module which is capable of producing at its output a scaled version of a current applied to its input.

12. A circuit arrangement as claimed in claim 11, wherein the static module has a plurality of outputs each of which is capable of producing an individually scaled output.

13. A circuit arrangement as claimed in claim 12, wherein the static module has a plurality of inputs by means of which a plurality of input currents may be applied to the static module to enable current addition or subtraction to be performed by the static module.

14. A circuit arrangement as claimed in claim 11, wherein the static module comprises a current scaling circuit, the current scaling circuit comprising means for applying an input current to an input branch of a first current mirror circuit, means for applying a bias current to the input branch of the first current mirror circuit, means for feeding a current from an output branch of the first current mirror circuit to an input branch of a second current mirror circuit, means for feeding a current from an output branch of the second current mirror circuit to the output of the static module, and means for subtracting a suitably scaled bias current from the current in the output branch of the second current mirror circuit so that the output current produced by the scaling circuit is a scaled version of the input current applied to the input of the scaling circuit.

15. A circuit arrangement as claimed in claim 14, wherein the means for applying a bias current to the input branch of the first current mirror circuit comprises a first current source and means for adding a current produced by the first current source to the input current and the means for subtracting a bias current comprises a second current source and a current summing junction to which an output current from the second current source and the output current from the output branch of the second current mirror are applied with appropriate polarity, and means for deriving the scaled output current from the summing junction.

16. A circuit arrangement as claimed in claim 15, wherein the static module is arranged to process a differential input current and produce a differential output current.

17. A circuit arrangement as claimed in claim 8 arranged to integrate differential input currents.

18. A circuit arrangement as claimed in claim 11, wherein the static module has a plurality of inputs by means of which a plurality of input currents may be applied to the static module to enable current addition or subtraction to be performed by the static module.

19. A circuit arrangement as claimed in claim 13, wherein the static module comprises a current scaling circuit, the current scaling circuit comprising means for applying an input current to an input branch of a first current mirror circuit, means for applying a bias current to the input branch of the first current mirror circuit, means for feeding a current from an output branch of the first current mirror circuit to an input branch of a second current mirror circuit, means for feeding a current from an output branch of the second current mirror circuit to the output of the static module, and means for subtracting a suitably scaled bias current from the current in the output branch of the second current mirror circuit so that the output current produced by the scaling circuit is a scaled version of the input current applied to the input of the scaling circuit.

20. A circuit arrangement as claimed in claim 11, wherein the static module is connected to process a differential input current and produce a differential output current.

* * * * *